United States Patent
Ukita et al.

(10) Patent No.: US 6,668,007 B2
(45) Date of Patent: *Dec. 23, 2003

(54) LASER APPARATUS

(75) Inventors: Masakazu Ukita, Kanagawa (JP); Masato Doi, Kanagawa (JP); Kazuo Honda, Kanagawa (JP)

(73) Assignee: Sony Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/192,381

(22) Filed: Nov. 16, 1998

(65) Prior Publication Data

US 2003/0091088 A1 May 15, 2003

(30) Foreign Application Priority Data

Nov. 17, 1997 (JP) .......................................... P09-315493

(51) Int. Cl.$^7$ ................................................. H01S 3/08
(52) U.S. Cl. .......................................................... 372/99
(58) Field of Search .............................. 372/29, 46, 99, 372/20

(56) References Cited

U.S. PATENT DOCUMENTS 5,222,071 A * 6/1993 Pezeshki et al. ............... 372/26
5,600,442 A * 2/1997 Minegishi et al. .......... 356/358
5,754,574 A * 5/1998 Lofthouse-Zeis et al. ..... 372/34

* cited by examiner

Primary Examiner—Paul Ip
Assistant Examiner—James Menefee
(74) Attorney, Agent, or Firm—Sonnenschein, Nath & Rosenthal LLP

(57) ABSTRACT

A laser apparatus capable of suppressing an influence of return light with respect to an optical output without causing an increase of a number of parts, an enlargement of the entire apparatus, or an increase of a power consumption, including a semiconductor laser having an optical resonator provided with a pair of opposing reflection mirrors, in which a resonator length is set to $L_{in}$, constituted so as to obtain a constant optical output from the optical resonator under constant drive conditions, and set so that reflectivities $R_f$ and $R_r$ of the reflection mirrors absorb a change of an output light intensity due to a change of the phase of the return light.

9 Claims, 4 Drawing Sheets

LASER APPARATUS

BACKGROUND OF THE INVENTION

1. Field of the Invention

The present invention relates to a laser apparatus having an optical resonator provided with a reflection portion such as a semiconductor laser.

2. Description of the Related Art

A semiconductor laser for example has an optical resonator constituted by a pair of opposing reflection mirrors, that is, a Fabry-Perot resonator.

It has been known that when a semiconductor laser having such a structure is built in an optical system with return light, the optical output thereof changes along with a change of the phase of the return light (refer to for example Ryoichi Ito and Michiharu Nakamura ed., *Semiconductor Laser—Fundamentals and Applications*—, Baifukan, 1989).

This fluctuation of the optical output becomes harmful noise in various applications of semiconductor lasers.

For example, it becomes a cause of noise in the recording or reproduction signal in the case of recording or reproduction from an optical disk, becomes a cause of noise in an optical signal in the case of optical communication, and becomes a cause of uneven color density or uneven color in the case of a laser beam printer.

Therefore, in the related art, generation of noise has been suppressed by installing an optical isolator, an optical shield plate, or a prism in the optical system so as to prevent the return light from striking the optical resonator of the semiconductor laser (refer to for example Japanese Unexamined Patent Publication (Kokai) No. 61-151849, Japanese Unexamined Patent Publication (Kokai) No. 3-54730, and Japanese Unexamined Patent Publication (Kokai) No. 6-162551), arranging an attenuation plate etc. for reducing the return light in comparison with the output of the semiconductor laser (refer to for example Japanese Unexamined Patent Publication (Kokai) No. 62-137734) and suppressing the influence of the return light, or superimposing a high frequency on a drive current particularly in the recording and reproduction from an optical disk (refer to for example Japanese Unexamined Patent Publication (Kokai) No. 60-140551).

However, in these techniques of the related art mentioned above, there are the disadvantages that the number of parts becomes large, the entire apparatus becomes bigger, the assembly or adjustment thereof is troublesome, and the power consumption is increased.

SUMMARY OF THE INVENTION

The present invention was made in consideration with such a circumstance and has as an object thereof to provide a laser apparatus capable of suppressing the influence of return light on the output light without causing an increase of the number of parts, an enlargement of the entire apparatus, or an increase of the power consumption.

To attain the above object, according to a first aspect of the present invention, there is provided a laser apparatus having an optical resonator provided with a reflection portion and obtaining a constant optical output from the optical resonator under constant drive conditions, wherein a reflectivity of the reflection portion is set so as to absorb a change of an intensity of an output light due to a change of a phase of return light.

Preferably, the laser apparatus is a current-driven semiconductor laser, and the reflectivity of the reflection portion is set so that there is a predetermined optical output value in a region in which current-optical output characteristics expressing the optical output with respect to the drive current in different return light phases intersect.

According to a second aspect of the present invention, there is provided a laser apparatus having an optical resonator provided with a pair of opposing reflection mirrors, obtaining a constant optical output from said optical resonator under constant drive conditions, and used built-in an optical system in which part $R_{ofb}P$ ($0<R_{ofb}<1$) of the optical output P returns to the optical resonator as return light, wherein whereby a time average value of the optical output P is defined as $P_{av}$, where an absolute value $|\Delta P|$ of a fluctuation $\Delta P = P - P_{av}$ of the optical output produced along with the change of a return light phase $\emptyset$ must not be more than a constant proportion $\epsilon$ with respect to $P_{av}$ and where $|\Delta P|/P_{av}$ must be not more than $\epsilon$, whereby the following are defined by designating a reflectivity of the side (forward) for fetching the optical output of the pair of opposing reflection mirrors constituting said optical resonator as $R_f$, the reflectivity of the side opposite to this (reverse) as $R_r$, a resonator length as $L_{in}$, an internal loss as $\alpha_i$, a differential gain as $g_N$, a proportion of coupling of the return light with the light inside the laser as $\eta_r$, the proportion of coupling of the return light with the output light from the laser as $\eta_t$, and an input/output efficiency and a threshold gain measured by a laser apparatus element where there is no return light as $\eta_s^0$ and $g^0$, respectively, and using these parameters or physical constants:

$$Y_1 = 1 + \sqrt{\eta_r R_{ofb} R_f}$$

$$Y_2 = 1 - \sqrt{\eta_r R_{ofb} R_f}$$

$$Z_1 = 1 + \sqrt{\frac{\eta_t R_{ofb}}{R_f} \cdot \frac{(1-R_f)}{Y_1}}$$

$$Z_2 = 1 - \sqrt{\frac{\eta_t R_{ofb}}{R_f} \cdot \frac{(1-R_f)}{Y_2}}$$

$$g_1 = g^0 - \frac{1}{L_{in}} \ln Z_1$$

$$g_2 = g^0 - \frac{1}{L_{in}} \ln Z_2$$

$$\frac{\eta_{S1}}{\eta_S^0} = \frac{g^0(g_1 - \alpha_i)(1 - \sqrt{R_f R_r})(1 + \sqrt{R_f/R_r})}{g_1(g^0 - \alpha_i)Y_1^2(1 - \sqrt{R_f R_r} Z_1)(1 + \sqrt{R_f/R_r} Z_1)}$$

$$\frac{\eta_{S2}}{\eta_S^0} = \frac{g^0(g_2 - \alpha_i)(1 - \sqrt{R_f R_r})(1 + \sqrt{R_f/R_r})}{g_2(g^0 - \alpha_i)Y_2^2(1 - \sqrt{R_f R_r} Z_2)(1 + \sqrt{R_f/R_r} Z_2)}$$

the following stands:

$$2\epsilon \geq \left| \left( \frac{\eta_{S1}}{\eta_S^0} - \frac{\eta_{S2}}{\eta_S^0} \right) + \frac{\eta_S^0}{P_{av} g_N L_{in}} \left[ \frac{\eta_{S1}}{\eta_S^0} \ln Z_1 - \frac{\eta_{S2}}{\eta_S^0} \ln Z_2 \right] \right|. \quad (A)$$

According to a third aspect of the present invention, there is provided a semiconductor laser apparatus having the optical resonator provided with a pair of opposing reflection mirrors, obtaining a constant optical output from said optical resonator under constant drive conditions, and used built-in an optical system in which part $R_{ofb}P$ ($0<R_{ofb}<1$) of the optical output P returns to the optical resonator as return light, wherein whereby a time average value of the optical output P is defined as $P_{av}$, where an absolute value $|\Delta P|$ of the fluctuation $\Delta P=P-P_{av}$ of the optical output produced along with a change of a return light phase $\emptyset$ must not be more than a constant proportion $\epsilon$ with respect to $P_{av}$ and where $|\Delta P|/P_{av}$ must be not more than $\epsilon$, whereby the following are defined by designating a reflectivity of the side (forward) for fetching the optical output of the pair of opposing reflection mirrors constituting said optical resonator as $R_f$, a reflectivity of the side opposite to this (reverse) as $R_r$, the resonator length as $L_{in}$, the internal loss as $\alpha_1$, a volume of an active region as $V_a$, an optical confinement coefficient of the active region as $\Gamma$, a proportion of an increase of the optical gain with respect to an increase of a carrier density of the active region as $g_N$, a carrier life of the carrier of the active region by spontaneous emission and a nonradiative recombination as $\tau_s$, a proportion of coupling of the return light with the light inside the laser as $\eta_t$, a proportion of coupling of the return light with an output light from the laser as $\eta_r$, a slope efficiency and the threshold gain measured by a laser apparatus element where there is no return light as $\eta_s^0$ and $g^0$, respectively, and an amount of charge as $e$, respectively, and using these parameters or physical constants:

$$Y_1 = 1 + \sqrt{\eta_r R_{ofb} R_f}$$

$$Y_2 = 1 - \sqrt{\eta_r R_{ofb} R_f}$$

$$Z_1 = 1 + \sqrt{\frac{\eta_t R_{ofb}}{R_f}} \frac{(1-R_f)}{Y_1}$$

$$Z_2 = 1 - \sqrt{\frac{\eta_t R_{ofb}}{R_f}} \frac{(1-R_f)}{Y_2}$$

$$g_1 = g^0 - \frac{1}{L_{in}} \ln Z_1$$

$$g_2 = g^0 - \frac{1}{L_{in}} \ln Z_2$$

$$\frac{\eta_{s1}}{\eta_s^0} = \frac{g^0(g_1 - \alpha_i)(1 - \sqrt{R_f R_r})(1 + \sqrt{R_f/R_r})}{g_1(g^0 - \alpha_i)Y_1^2(1 - \sqrt{R_f R_r} Z_1)(1 + \sqrt{R_f/R_r} Zsub1)}$$

$$\frac{\eta_{s2}}{\eta_s^0} = \frac{g^0(g_2 - \alpha_i)(1 - \sqrt{R_f R_r})(1 + \sqrt{R_f/R_r})}{g_2(g^0 - \alpha_i)Y_2^2(1 - \sqrt{R_f R_r} Z_2)(1 + \sqrt{R_f/R_r} Z_2)}$$

the following stands:

$$2\epsilon \geq \left| \left( \frac{\eta_{s1}}{\eta_s^0} - \frac{\eta_{s2}}{\eta_s^0} \right) + \frac{eVa\eta_s^0}{P_{av}\Gamma g_N L_{in} \tau_s} \left[ \frac{\eta_{s1}}{\eta_s^0} \ln Z_1 - \frac{\eta_{s2}}{\eta_s^0} \ln Z_2 \right] \right| \quad \text{(B)}$$

Preferably, when there is return light, it operates where the fluctuation in the optical output due to the return light in a specific optical output is not more than a constant proportion ($\epsilon$).

BRIEF DESCRIPTION OF THE DRAWINGS

The above object and features of the present invention will be more apparent from the following description of the preferred embodiments given with reference to the accompanying drawings, wherein.

DESCRIPTION OF THE PREFERRED EMBODIMENTS

Below, embodiments of the laser apparatus according to the present invention will be explained in relation to the drawings.

In the embodiments, the explanation will be made by taking as an example a case of a semiconductor laser having a Fabry-Perot resonator constituted by a pair of opposing reflection mirrors.

Figure 1:
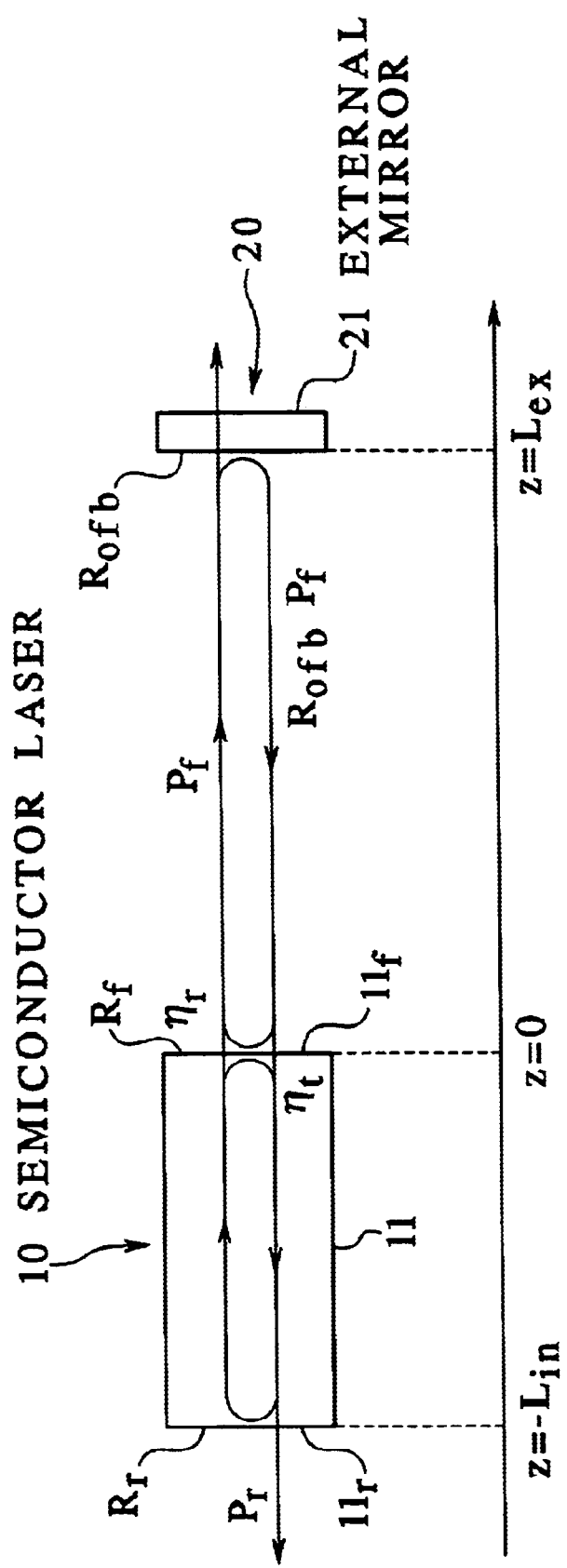
FIG. 1 is a schematic view when a semiconductor laser having a Fabry-Perot resonator operates built into an optical system in which there is return light.

FIG. 1 is a schematic view in the case where a semiconductor laser having a Fabry-Perot resonator operates built into an optical system in which there is return light.

The semiconductor laser 10 according to the present invention has a Fabry-Perot resonator 11 provided with a pair of opposing reflection mirrors 11$f$ and 11$r$ and a resonator length set at $L_{in}$, is constituted so as to obtain a constant optical output from the Fabry-Perot resonator 11 under constant drive conditions, and is set so that the reflectivities Rf and Rr of the reflection mirrors 11$f$ and 11$r$ absorb a change of the intensity of the output light due to a change of the phase of the return light.

Note that the semiconductor laser 10 is for example constituted by a laser of a double hetero (DH) structure (DH laser) comprised of an AlGaAs compound semiconductor in which a not illustrated clad layer is made of $Al_yGa_{(1-y)}As$ and an active layer is made of $Al_xGa_{(1-x)}As$.

The semiconductor laser 10 is driven by a constant output (APC drive) by feedback having a slower response than the speed of change of the phase $\emptyset$ of the return light (return light phase) or a DC current drive (DC drive) so as to obtain a constant optical output from the Fabry-Perot resonator 11 under constant drive conditions.

The reflectivities Rf and Rr of the reflection mirrors 11$f$ and 11$r$ and various parameters are set as follows so as to absorb a change of the intensity of the optical output due to the change of the return light.

Namely, the semiconductor laser 10 is constituted so that in applications of the optical system in which it is built, when a time average value of the optical output P is defined as $P_{av}$, where an absolute value $|\Delta P|$ of a fluctuation $\Delta P=P-P_{av}$ of the optical output produced along with the change of a return light phase $\emptyset$ must not be more than a constant proportion $\epsilon$ with respect to $P_{av}$, that is, $|\Delta P|/P_{av}$ must be not more than $\epsilon$, when the following are defined by designating a reflectivity of the side (forward) for fetching the optical output of the pair of opposing reflection mirrors 11$f$ and 11$r$ constituting the optical resonator 11 of the semiconductor laser 10 as $R_f$, the reflectivity of the side opposite to this (reverse) as $R_r$, a resonator length as $L_{in}$, an internal loss as $\alpha_i$, a volume of an active region as $V_a$, an optical confinement coefficient of the active region as $\Gamma$, a proportion of an increase of the optical gain with respect to an increase of a carrier density of the active region as $g_N$, a carrier life of the carrier of the active region by spontaneous emission and a nonradiative recombination as $\tau_S$, a proportion of coupling of the return light with the light inside the laser as $\eta_t$, a proportion of coupling of the return light with an output light from the laser as $\eta_r$, a slope efficiency and the threshold gain measured by a laser apparatus element where there is no return light as $\eta_s^0$ and $g^0$, respectively, and an amount of charge as e, respectively, and using these parameters or physical constants:

$$Y_1 = 1 + \sqrt{\eta_r R_{ofb} R_f}$$

$$Y_2 = 1 - \sqrt{\eta_r R_{ofb} R_f}$$

$$Z_1 = 1 + \sqrt{\frac{\eta_t R_{ofb}}{R_f}} \frac{(1-R_f)}{Y_1}$$

$$Z_2 = 1 - \sqrt{\frac{\eta_t R_{ofb}}{R_f}} \frac{(1-R_f)}{Y_2}$$

$$g_1 = g^0 - \frac{1}{L_{in}} \ln Z_1$$

$$g_2 = g^0 - \frac{1}{L_{in}} \ln Z_2$$

$$\frac{\eta_{S1}}{\eta_S^0} = \frac{g^0(g_1 - \alpha_i)(1 - \sqrt{R_f R_r})(1 + \sqrt{R_f/R_r})}{g_1(g^0 - \alpha_i)Y_1^2(1 - \sqrt{R_f R_r} Z_1)(1 + \sqrt{R_f/R_r} Z_1)}$$

$$\frac{\eta_{S2}}{\eta_S^0} = \frac{g^0(g_2 - \alpha_i)(1 - \sqrt{R_f R_r})(1 + \sqrt{R_f/R_r})}{g_2(g^0 - \alpha_i)Y_2^2(1 - \sqrt{R_f R_r} Z_2)(1 + \sqrt{R_f/R_r} Z_2)}$$

the following stands:

$$2\epsilon \geq \left| \left( \frac{\eta_{S1}}{\eta_S^0} - \frac{\eta_{S2}}{\eta_S^0} \right) + \frac{eV a \eta_S^0}{P_{av} \Gamma g_N L_{in} \tau_S} \left[ \frac{\eta_{S1}}{\eta_S^0} \ln Z_1 - \frac{\eta_{S2}}{\eta_S^0} \ln Z_2 \right] \right| \quad (C)$$

Below, an explanation will be made, with reference to the drawings, of the fact that a change of the intensity of the output light due to a change of the phase of the return light can be absorbed by setting the reflectivities $R_f$ and $R_r$ of the reflection mirrors 11f and 11r as mentioned above in the semiconductor laser 10.

Note that in the case of a distributed Bragg reflector (DBR) laser (DBR laser) where the reflection mirrors are replaced by grating waveguides, a similar discussion can be made by replacing the reflectivities relating to the optoelectric field amplitudes of the reflection mirrors or transmittance by a complex number.

Further, in the case of a vertical cavity surface emitting laser (VCSEL) as well, since the vertical resonator is constituted by a Bragg reflector comprised of a dielectric or a semiconductor multi-layer film, the same discussion can be made as with a DBR laser.

Therefore, an explanation will be made later of the case of a DBR laser containing a VCSEL.

First, consider FIG. 1, that is, a schematic view of the case where a semiconductor laser having a Fabry-Perot resonator operates built into an optical system having return light.

In FIG. 1, when the length of the resonator of the semiconductor laser 10 is defined as $L_{in}$, a z-axis is set so that the reverse reflection mirror 11r of the reflectivity $R_r$ is located at $z=-L_{in}$ and the forward reflection mirror 11f of the reflectivity $R_f$ is located at $z=0$.

The light from the semiconductor laser is output from both of these two reflection mirrors 11r and 11f toward the outside.

At this time, the output from $z=-L_{in}$ in a $-z$ direction, that is, in reverse, is defined as the reverse optical output $P_r$, while the output from $z=0$ in a $+z$ direction, that is, forward, is defined as the forward optical output $P_f$.

Between these optical outputs, the forward optical output $P_f$ is used for the recording and reproduction from the optical disk and applications in the optical communications etc. On the other hand, the reverse optical output $P_r$ is frequently used for monitoring the optical output of the semiconductor laser.

The forward optical output $P_f$ from the semiconductor laser 10 is partially reflected by the optical system to become return light which is returned to the semiconductor laser.

Here, the position of generation of the most important return light from the optical system is expressed by an optically equivalent distance $L_{ex}$.

Further, the intensity of the return light is proportional to the forward light $P_f$, therefore is expressed as $R_{ofb} P_f$.

In FIG. 1, the optical system 20 generating this return light is equivalently expressed by an external mirror 21 having a reflectivity $R_{ofb}$ placed at the position of $z=L_{ex}$.

In the return light $R_{ofb} P_f$ returned to the semiconductor laser 10, part $R_f R_{ofb} P_f$ thereof is reflected by the forward reflection mirror 11f, and part having a proportion of $0 < \eta_r \leq 1$ in the reflected light is coupled with the forward output light $P_f$ from the semiconductor laser.

Further, in the return light $R_{ofb} P_f$ returned to the semiconductor laser 10, a part having a proportion of $0 < \eta_t \leq 1$ in the light $(1-R_f) R_{ofb} P_f$ not reflected by the forward reflection mirror 11f, but transmitted through the forward reflection mirror 11f is coupled with the light advanced in the $-z$ direction inside the semiconductor laser.

By the coupling of the return light with the light inside the semiconductor laser or the emitted light from the semiconductor laser, the forward optical output $P_f$ becomes a value different from that of the optical output when there is no return light.

Further, it has been also known that, according to some intensity and phase of the return light or distance $L_{ex}$ up to the return light generation position, the operating state of the semiconductor laser 10 changes due to the influence of the return light and that a phenomenon where the optical output periodically or chaotically vibrates in a band of a frequency determined by $L_{ex}$, i.e., $f_{ex} = c/2L_{ex}$ where c is the speed of light in vacuum).

Such an optical output vibration sometimes becomes a problem in application. In this case, there is no method for solving the problem other than the method of reducing the intensity of the return light per se as much as possible.

However, when the frequency band important in the application is lower than the frequency band of the optical output vibration represented by $f_{ex}$, a fluctuation of an average optical output obtained by averaging these optical output vibrations at a time interval of for example $T > 1/f_{ex}$ becomes a problem.

It can be confirmed from experiments or numerical calculations that the value of this time averaged optical outputs is substantially equal to the value assuming the steady state.

Therefore, it is possible to assume a steady state as follows to find the equation of the forward optical output $P_f$ when there is the return light and reduce the fluctuation of the forward optical output $P_f$ due to the return light in the frequency region lower than $f_{ex}$ to such an extent where there is no problem in the application based on this.

A complex amplitude of the intensity of the electric field of the light just near the forward reflection mirror inside the semiconductor laser, that is, at z=−0 and advancing in the −z direction, is expressed by E, the complex amplitude of the intensity of the electric field of the light emitted forward from the semiconductor laser just near the forward reflection mirror, that is at z=+0, is expressed as $E_f$, and the complex amplitude of the intensity of the electric field of the light emitted reverse from the semiconductor laser just near the reverse reflection mirror, that is, at z=−$L_{in}$+0, is expressed as $E_r$.

The complex amplitudes $E_f$ and $E_r$ of the intensity of the electric field have the following relationships with the forward optical output $P_f$ and the reverse optical output $P_r$, respectively:

$$P_f = c\epsilon_0 |E_f|^2 \quad (1)$$

$$P_r = c\epsilon_0 |E_r|^2 \quad (2)$$

Here, $\epsilon_0$ is the dielectric constant of vacuum, and c is the speed of light in vacuum.

The internal optical loss determined by the semiconductor material constituting the semiconductor laser 10 and the structure of the semiconductor laser is defined as $\alpha_i$, the gain produced by excitation of the optical active region of the semiconductor laser due to the injection of the current is defined as g, and the equivalent refractive index of the resonator determined by the material constituting the semiconductor laser and the structure of the semiconductor laser is defined as n.

There is no problem even if the internal optical loss $\alpha_i$ and the gain g are assumed to be spatially uniform in the resonator of the semiconductor laser 10.

As already explained, it is assumed that oscillation occurs in the steady state and the oscillation wavelength thereof in the vacuum is defined as λ.

At this time, the following relations stand among E, $E_f$, and $E_r$:

$$E_f / \sqrt{n} = \sqrt{(1-R_f)R_r} \exp\left[(g-\alpha_i)L_{in} - \frac{4\pi i n L_{in}}{\lambda}\right] E - \sqrt{\eta_r R_f R_{ofb}} \exp\left(\frac{-4\pi i L_{ex}}{\lambda}\right) E_f / \sqrt{n} \quad (3)$$

$$E = \sqrt{R_f R_r} \exp\left[(g-\alpha_i)L_{in} - \frac{4\pi i n L_{in}}{\lambda}\right] E + \sqrt{\eta_t(1-R_f)R_{ofb}} \exp\left(\frac{-4\pi i L_{ex}}{\lambda}\right) E_f / \sqrt{n} \quad (4)$$

$$E_r / \sqrt{n} = \sqrt{1-R_r} \exp\left[\frac{(g-\alpha_i)L_{in}}{2} - \frac{2\pi i n L_{in}}{\lambda}\right] E \quad (5)$$

Here, a steady oscillation state is assumed, so E and $E_f$ are not zero.

Therefore, the next equations which should be satisfied by the gain g and the oscillation wavelength λ are obtained from equations (3) and (4) after eliminating E and $E_f$.

$$g = \alpha_i + \frac{1}{2L_{in}} \ln \frac{1}{R_f R_r} - \frac{1}{L_{in}} \ln(|Z|) \quad (6)$$

$$p = \frac{2nL_{in}}{\lambda} - \frac{1}{2\pi} \text{Arg}(Z) \quad (p: \text{integer}) \quad (7)$$

Here, Arg{Z} expresses an argument of the complex number Z, and Z is defined as follows:

$$Z \equiv 1 + \sqrt{\frac{\eta_t R_{ofb}}{R_f}} \frac{(1-R_f)\exp(-i\emptyset)}{Y} \quad (8)$$

$$Y \equiv 1 + \sqrt{\eta_r R_f R_{ofb}} \exp(-i\emptyset) \quad (9)$$

Here, the phase $\emptyset = 4\Pi L_{ex}/\lambda$ of the return light based on the optical phase inside the laser was defined.

On the other hand, rate equations describing the operation of the semiconductor laser are assumed as follows with respect to the number of photons S inside the optical resonator 11 of the semiconductor laser 10 and the carrier density N of the active region:

$$\frac{dS}{dt} = \frac{c}{n}[\Gamma G(N) - g]S \quad (10)$$

$$\frac{dN}{dt} = \frac{I}{eV_a} - \frac{N}{\tau_s} - \frac{c}{n}\Gamma G(N)\frac{S}{V_a} \quad (11)$$

Here, the optical gain generated in the active region due to the injected carriers is expressed by a function G(N) of the carrier density N. Further, the contribution of the spontaneously emitted light with respect to the change of the number of photons along with time is not important so is ignored in the following discussion.

Further, as mentioned above, e is the amount of the charge, I is the injected current, Γ is the optical confinement coefficient determined by the structure of the semiconductor laser, $V_a$ is the volume of the active region determined by the structure of the semiconductor laser, and $\tau_s$ is the carrier life determined by the probability of spontaneous emission and the probability of nonradiative recombination determined by the material and structure.

In the rate equations (10) and (11), if S of the steady oscillation state is found by defining S>0, dS/dt=0, and dN/dt=0, the following equation is obtained:

$$S = \frac{n}{ceg}(I - I_{th}) \quad (12)$$

Here, the threshold current value $I_{th}$ is defined as in the following equation by using an inverse function $G^{-1}$ of the optical gain G(N):

$$I_{th} \equiv \frac{eV_a}{\tau_s} G^{-1}(g/\Gamma) \quad (13)$$

Since S>0, equation (12) has a meaning only when the injected current I is larger than the threshold current value $I_{th}$, that is, I>$I_{th}$. When I≦$I_{th}$, the contribution of the spontaneously emitted light is ignored here, so S=0.

In the rate equation used here, it is assumed that the current injected into the semiconductor laser is all consumed in the active region.

However, in actuality, there are a current flowing in a region other than the active region and a current which flows in the active region but is not consumed and leaves.

In order to incorporate the contribution of these invalid currents in the equation of S, two parameters 0<ζ≦1 and $\Delta I_{th}$≧0 are introduced, and equation (12) is rewritten as follows:

$$S \equiv \frac{\zeta n}{ceg}(I - I_{th} - \Delta I_{th}) \quad (14)$$

That is, $\Delta I_{th}$ expresses the increase of the threshold current due to the invalid current, and $\zeta$ expresses the fact that the proportion of the increase of the number of photons when the current is increased becomes small in comparison with the case of the original equation (12) since there is the invalid current.

Next, the relationship between the number of photons S inside the resonator of the semiconductor laser and the electric field intensity E will be found.

The dependency of the electric field intensity inside the optical resonator 11 of the semiconductor laser 10 with respect to the time t and the position z is expressed as $E^+(z)\exp[i(\omega t - kz)] + E^-(z)\exp[i(\omega t + kz)]$ by the light $\exp[i(\omega t \pm kz)]$ advancing in the $\pm z$ direction and the complex amplitude of $E(z)$ depending upon each z.

Here, $\omega = 2\Pi c/\lambda$ is an angle frequency of the laser beam, and $k = 2\Pi n/\lambda$ is a wave number inside the semiconductor laser resonator of the laser beam.

The electric field intensity E is defined as the amplitude of the traveling wave in the reverse direction, therefore a relationship of $E^-(z=0) = E$ stands.

The gain g and the internal loss $\alpha_i$ are assumed to be spatially uniform, so become as follows when $-L_{in} \leq z \leq 0$:

$$E^-(z) = E\exp\left(-\frac{g - \alpha_i}{2}z\right) \quad (15)$$

$$E^+(z) = \sqrt{R_r}\, E e^{-2ikLin}\exp\left[\frac{g - \alpha_i}{2}(2L_{in} + z)\right] \quad (16)$$

Using these equations, the number of photons S inside the optical resonator 11 of the semiconductor laser 10 is expressed by $|E|^2$ as follows:

$$S = \frac{n^2 \epsilon_0}{\hbar \omega}\int_{-Lin}^{o} dz(|E^+(z)|^2 + |E^-(z)|^2) \quad (17)$$

$$= \frac{n^2 \epsilon_0}{\hbar \omega}\frac{|E|^2}{g - \alpha_i}(e^{(g-\alpha i)Lin} - 1)(1 + R_r e^{(g-\alpha i)Lin})$$

Here, $\bar{h}$ is the constant obtained by dividing Planck's constant h by $2\Pi$, and $\bar{h}\omega$ is the energy per photon.

When equation (6) of the gain g is substituted into this equation, the relationship between the number of photons S and the electric field intensity E as shown in the following equation is obtained:

$$S = \frac{n^2 \epsilon_0}{\hbar\omega(g - \alpha_i)}\left(\sqrt{\frac{R_r}{R_f}}\frac{1}{|Z|} + 1\right)\left(\sqrt{\frac{1}{R_f R_r}}\frac{1}{|Z|} - 1\right)|E|^2 \quad (18)$$

Taking note of condition equations (6) and (7) satisfied by the gain g and the oscillation wavelength $\lambda$, by eliminating $E_f$ from equations (1) and (4), further eliminating $|E|^2$ using equation (18), and further eliminating S by using equation (14), the equation of the forward optical output $P_f$ is obtained as follows:

$$P_f = \eta_s(I - Ith - \Delta Ith) \quad (19)$$

Here, the slope efficiency $\eta_s$ was defined by the following equation:

$$\eta_s \equiv \frac{\zeta \hbar \omega}{e}\frac{g - \alpha_i}{g}\frac{(1 - R_f)}{|Y|^2(1 - \sqrt{R_f R_r}\,|Z|)(1 + \sqrt{R_f/R_r}\,|Z|)} \quad (20)$$

The forward optical output $P_f$ depends upon the return light phase $\emptyset = 4\Pi L_{ex}/\lambda$ through Y and Z contained in equations (13), (20), and (6) of the threshold current value $I_{th}$, slope efficiency $\eta_s$, and gain g.

For example, if the position of occurrence of the return light from the optical system changes even in a very small amount of about the wavelength $\lambda$, the return light phase $\emptyset$ changes by $2\Pi$ or more through the change of the position $L_{ex}$ of generation of the return light.

Further, in the optical system into which the actual semiconductor laser is built, the position (distance) $L_{ex}$ of the generation of the return light is larger than the oscillation wavelength $\lambda$ in many cases.

Accordingly, even in a case where the temperature of the semiconductor laser element changes due to a heat generation or the like and the oscillation wavelength thereof slightly changes, the return light phase $\emptyset$ largely changes.

For example, where a semiconductor laser having an oscillation wavelength of $\lambda = 1$ μm is used in an optical system in which the position of generation of the return light is $L_{ex} = 1$ cm, the return light phase $\emptyset$ changes by about $4\Pi$ even by a change of the oscillation wavelength by only 0.01%. In many cases, a change of the temperature of the semiconductor laser element of 1° C. is sufficient for occurrence of a change of 0.01% of this oscillation wavelength $\lambda$.

It is seen from equations (9) and (8) that $|Y|$ and $|Z|$ change from maximum values to minimum values when such a change of the return light phase $\emptyset$ occurs.

Along with this, according to equation (19), the optical output $P_f$ of the semiconductor laser operating by the constant injected current I changes.

That is, if the injected current I is constant or even in a case where the optical output $P_f$ or $P_r$ is monitored and the injected current I is controlled by the feedback so as to hold this at a constant value, if it can be regarded that the response speed of the feedback control is slower than the speed of change of the return light phase $\emptyset$ and the injected current I is regarded as constant with respect to the change of the return light phase $\emptyset$, it can be theoretically derived that the forward optical output $P_f$ changes due to a slight change of the position $L_{ex}$ of the generation of the return light or the change of the return light phase $\emptyset$ due to the change of the oscillation wavelength $\lambda$ of the semiconductor laser.

Note that, at this time, simultaneously, it is possible to indicate that the reverse optical output $P_r$ changes as well, but the explanation thereof is omitted here.

Figure 2:
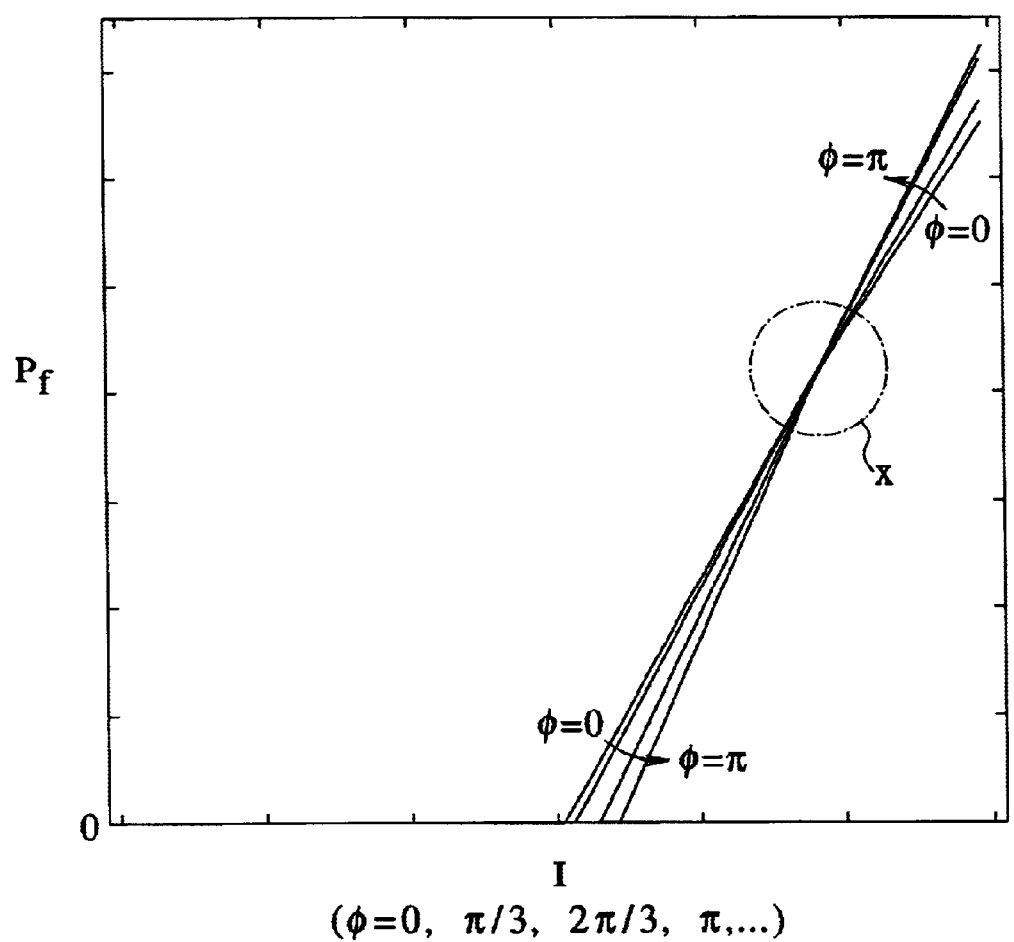
FIG. 2 is a view of a current-optical output characteristic of a semiconductor laser for explaining a state of change of a forward optical output $P_f$ due to the change of a phase $\emptyset$ of return light.

The situation of the change of the forward optical output $P_f$ due to the change of this return light phase $\emptyset$ will be explained in detail based on FIG. 2 showing the current-optical output characteristic of the semiconductor laser.

Note that, in FIG. 2, the abscissa indicates the operating (injected) current value I, and the ordinate indicates the forward optical output $P_f$.

When the current I is increased from 0, if I exceeds the threshold current value $I_{th} + \Delta I_{th}$, the forward optical output $P_f$ is abruptly increased and the semiconductor laser oscillates.

The proportion of the increase of the forward optical output $P_f$ with respect to the current I in this oscillation state, that is, the inclination of the current-optical output characteristic, is the slope efficiency $\eta_s$.

The threshold current value Ith and the slope efficiency $\eta_s$ change due to the change of the return light phase $\emptyset$ as already explained.

In FIG. 2, the situation of the change is exaggeratedly drawn for easier understanding. It does not show the characteristic of an actual semiconductor laser. At this time, when the threshold current $I_{th}$ is increased due to the change of the return light phase Ø, the slope efficiency $\eta_S$ is also increased. When the threshold current value $I_{th}$ is reduced, the slope efficiency $\eta_S$ is also reduced.

Accordingly, as shown in FIG. 2, there is a narrow region X in which the current-optical output characteristics at different return light phases Ø intersect with each other.

In this region X, when the operating current value I is constant, the change of the forward optical output $P_f$ is small even if the return light phase Ø changes. On the other hand, in regions other than the region X, where the operating current value I is constant, the forward optical output $P_f$ changes by a large extent if the return light phase Ø changes.

The semiconductor laser 10 according to the present embodiment is suitably designed and fabricated so that there is a predetermined optical output value in this region X in which current-optical output characteristics having different return light phases Ø intersect.

Below, by utilizing equation (19), a condition necessary for design and configuration of the laser apparatus in which the fluctuation ΔP of the optical output from $P_{av}$ is placed in the range of a predetermined proportion with respect to the forward optical output $P_{av}$ obtained by averaging over time at a sufficiently long time interval in comparison with the speed of the change of the return light phase even if the return light phase Ø changes is found.

It is learned that when the return light phase Ø fluctuates, the forward optical output $P_{av}$ averaged in time takes a value near the forward optical output $P_f$ where there is no return light.

Further, a magnitude ΔP of the fluctuation of the forward optical output $P_f$ accompanying the fluctuation of the return light phase Ø becomes at the most half of a difference between the value of the forward optical output $P_f$ when Ø is set equal to 0 and the value of the forward optical output $P_f$ when Ø is set to equal to Π in equation (19) except in the region X shown in FIG. 2, These facts are expressed by equations as follows:

$$P_{av} = \eta_S^0 (I - I_{th}^0 - \Delta I_{th}) \tag{21}$$

$$|\Delta P| \leq |\eta_S(\emptyset=0)(I - I_{th}(\emptyset=0) - \Delta I_{th}) - \eta_S(\emptyset=\pi)(I - I_{th}(\emptyset=\pi) - \Delta I_{th})|/2 \tag{22}$$

Here, $\eta_S^0$ and $I_{th}^0$ express values of the slope efficiency $\eta_S$ and the threshold current $I_{th}$ in the case where there is no return light, that is, $R_{ofb} = 0$, respectively.

In the region X, equation (22) does not stand, but if it is designed so that the magnitude ΔP of the fluctuation becomes ε or less based on this equation, the predetermined forward optical output value can be made exist in the region X or in the vicinity of the region X.

When eliminating the injected current value I from equation (22) by using equation (21) and further dividing both sides by $P_{av}$, the following equations are obtained:

$$\frac{|\Delta P|}{P_{av}} \leq \tag{23}$$

$$\frac{1}{2} \left| \frac{\eta_S(0)}{\eta_S^0} \left\{ 1 - \frac{\eta_S^0}{P_{av}} [I_{th}(0) - I_{th}^0] \right\} - \frac{\eta_S(\pi)}{\eta_S^0} \left\{ 1 - \frac{\eta_S^0}{P_{av}} [I_{th}(\pi) - I_{th}^0] \right\} \right|$$

When the right side of this inequality is made ε*, ε* can be controlled to the target value of ε or less by suitably designing the semiconductor laser using $P_{av}$ as the target optical output of the semiconductor laser.

That is, when ε* is set as in the following equation, a semiconductor laser is obtained in which the absolute value |ΔP| of the optical output fluctuation is a constant proportion ε or less with respect to the average optical output $P_{av}$, that is, $|\Delta P|/P_{av} \leq \epsilon^* \leq \epsilon$.

$$\epsilon^* \equiv \frac{1}{2} \left| \frac{\eta_S(0)}{\eta_S^0} \left\{ 1 - \frac{\eta_S^0}{P_{av}} [I_{th}(0) - I_{th}^0] \right\} - \frac{\eta_S(\pi)}{\eta_S^0} \left\{ 1 - \frac{\eta_S^0}{P_{av}} [I_{th}(\pi) - I_{th}^0] \right\} \right| \tag{24}$$

In order to actually design and fabricate a semiconductor laser, it would be convenient if there were a simpler equation of ε*. Below, an approximate equation of such an ε* is derived.

First, $I_{th}(0) - I_{th}^0$ and $I_{th}(\Pi) - I_{th}^0$ contained in equation (24) are simplified by using approximation. If equation (13) of the threshold current value $I_{th}$ is used, it can be expressed as in the following equation:

$$I_{th}(\emptyset) - I_{th}^0 = \frac{eV_a}{\tau_S} [G^{-1}(g/\Gamma) - G^{-1}(g^0/\Gamma)] \tag{25}$$

Here, $g^0 \equiv \alpha_i - \ln(R_f R_r)/(2L_{in})$ is the gain g when there is no return light.

The dependency G(N) of the optical gain generated in the active region with respect to the carrier density N is approximated by a linear function in the vicinity of the carrier density at which the semiconductor laser operates thereby to obtain $G(N) = g_N(N - N_t)$.

Here, $g_N$ and $N_t$ are coefficient parameters at the time of approximation. In particular, $g_N$ is the parameter expressing how much the optical gain increases with respect to an increase of the carrier density in the vicinity of the carrier density at which the semiconductor laser operates—important when fabricating a semiconductor laser.

When using this approximation, equation (25) can be modified as follows by using equation (6) satisfied by the gain g:

$$I_{th}(\emptyset) - I_{th}^0 = \frac{eV_a}{\tau_S} \left( \frac{g}{\Gamma g_N} - \frac{g^0}{\Gamma g_N} \right) = -\frac{eV_a}{\Gamma g_N L_{in} \tau_S} \ln(|Z(\emptyset)|) \tag{26}$$

From this equation, $I_{th}(0) - I_{th}^0$ and $I_{th}(\Pi) - I_{th}^0$ can be simply expressed as in the following equations, respectively:

$$I_{th}(0) - I_{th}^0 = -\frac{eV_a}{\Gamma g_N L_{in} \tau_S} \ln Z(0) \tag{27}$$

$$I_{th}(\pi) - I_{th}^0 = -\frac{eV_a}{\Gamma g_N L_{in} \tau_S} \ln Z(\pi) \tag{28}$$

In these modified equations, the fact that Y(0), Y(Π), Z(0), and Z(Π) are real numbers was used.

By using equations (27) and (28), equation (24) of ε* can be rewritten to the following simple format:

$$\epsilon^* = \frac{1}{2} \left| \left[ \frac{\eta_S(0)}{\eta_S^0} - \frac{\eta_S^0(\pi)}{\eta_S^0} \right] + \frac{1}{P_{av}} \frac{eV_a \eta_S^0}{\Gamma g_N L_{in} \tau_S} \left[ \frac{\eta_S(0)}{\eta_S^0} \ln Z(0) - \frac{\eta_S(\pi)}{\eta_S^0} \ln Z(\pi) \right] \right| \tag{29}$$

Here, by equation (20) of the slope efficiency $\eta_S$, $\eta_S(\emptyset)/\eta_S^0$ (Ø=0 or Π) is expressed as follows when noting that Y(0), Y(Π), Z(0), and Z(Π) are still real numbers:

$$\frac{\eta_S(\emptyset)}{\eta_S^0} = \left[\frac{g^0(g(\emptyset) - \alpha_i)}{g(\emptyset)(g^0 - \alpha_i)}\right] \times \qquad (30)$$

$$\frac{(1 - \sqrt{R_f R_r})(1 + \sqrt{R_f / R_r})}{Y^2(\emptyset)(1 - \sqrt{R_f R_r} Z(\emptyset))(1 + \sqrt{R_f / R_r} Z(\emptyset))} \quad (\emptyset = 0 \text{ or } \pi)$$

When defining $Y_1 \equiv Y(0)$, $Y_2 \equiv Y(\Pi)$, $Z_1 \equiv Z(0)$, $Z_2 \equiv Z(\Pi)$, $g_1 \equiv g(0)$, $g_2 \equiv g(\Pi)$, $\eta_{S1} \equiv \eta_S(0)$, and $\eta_{S2} \equiv \eta_S(\Pi)$, from equation (29), the inequality $\epsilon^* \leq \epsilon$ is equivalent to the condition equations indicated by equations (B) and (C).

Below, based on equation (29), an example of the method of production of a semiconductor laser realizing the targeted $\epsilon^*$ at the predetermined time averaged optical output $P_{av}$ will be explained.

An apparatus constituted by a laser of a double hetero (DH) structure (DH laser) comprised of a general AlGaAs compound semiconductor and in which the clad layer is made of $Al_yGa_{(1-Y)}As$ and the active layer is made of $Al_xGa_{(1-x)}As$, with a return light of 1%, that is, $R_{of\!b}=0.01$, and with a maximum value of the optical output fluctuation due to the return light of $\epsilon=0.05$ or less, that is, 5% or less, when the time average forward output $P_{av}$ is 5 mW when built in an optical system in which the coupling efficiency of the return light is expressed by $\eta_r \eta_t = 1$ is for example designed as follows:

The Al composition x of the active layer is determined by the oscillation wavelength $\lambda$ and is selected to be about $x=0.12$ in the case where $\lambda=0.78 \ \mu m$. The Al composition y of the clad layer is selected to be $x<y$ so that the carriers and the light are sufficiently confined in the active region and is selected as for example $y=0.47$.

The internal loss $\alpha_i$ and the carrier life $\tau_s$ are mainly determined by the material. In the case of an AlGaAs compound semiconductor, $\alpha_i=10 \ cm^{-1}$ and $\tau_s=2$ ns are respectively representative values.

When defining the length of the resonator of the semiconductor laser as $L_{in}=250 \ \mu m$, the thickness of the $Al_xGa_{(1-x)}As$ active layer as 0.1 $\mu m$, and the width of the region into which the current is injected and which optically becomes active as 3 $\mu m$, the volume of the active region becomes $V_a=75 \ \mu m^3$, and the optical confinement coefficient becomes about $\Gamma=0.1$.

The proportion $g_N$ of the increase of the optical gain with respect to the increase of the carrier density and the parameter $\zeta$ expressing the effect of the invalid current are determined by the material and the structure. These are estimated as being about $g_N=7 \times 10^{-16} \ cm^{-16}/cm^{-3}$ and $\zeta=0.9$ in the case of the above material and structure.

Figure 3:
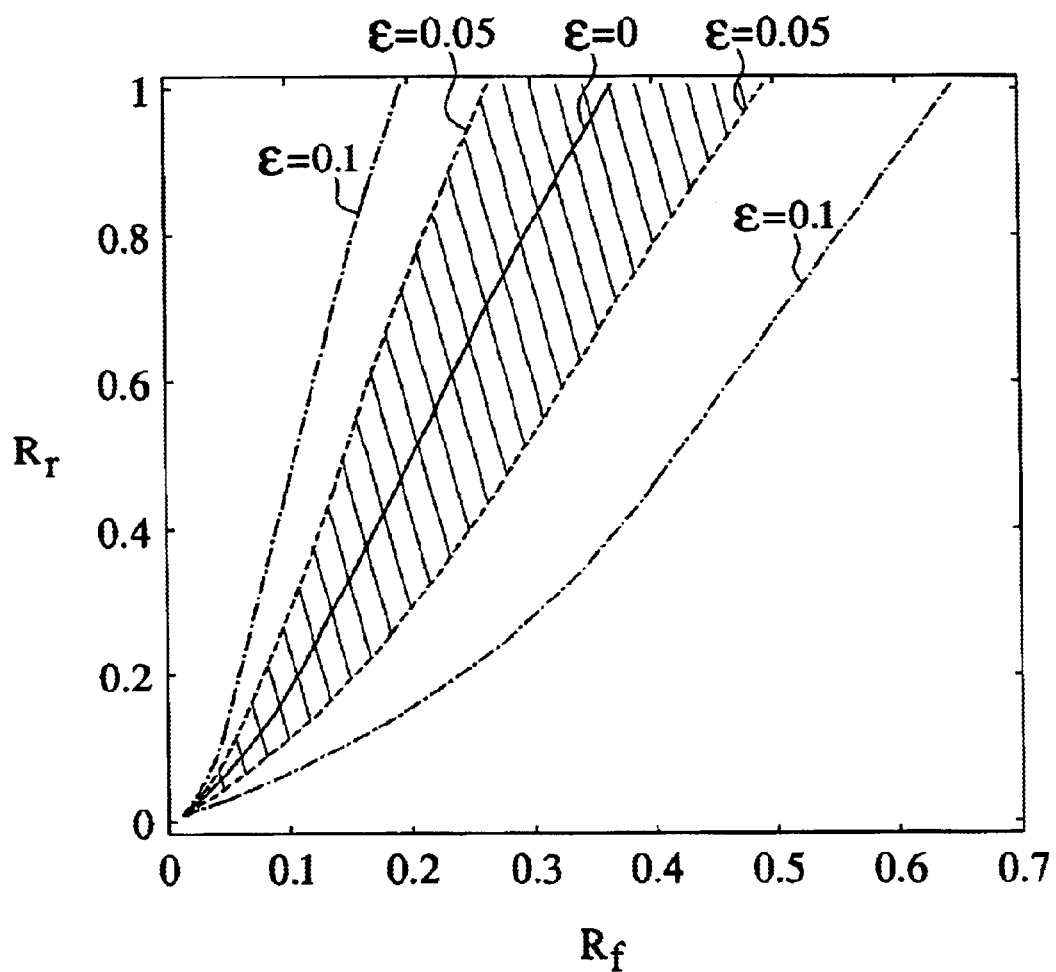
FIG. 3 is a view in which parameters are assigned in an equation, $\epsilon^*$ is calculated by a computer by using reflectivity $R_f$ and $R_r$ of forward and reverse reflection mirrors as variables, and they are expressed in the form of a contour.

FIG. 3 is a contour view obtained by substituting the above parameters into equation (24), calculating the $\epsilon^*$ by a computer by using the remaining design parameters of the semiconductor laser, that is, the reflectivities $R_f$ and $R_r$ of the forward and reverse reflection mirrors as variables, and expressing the result thereof in the form of a contour.

In FIG. 3, by selecting the reflectivities $R_f$ and $R_r$ in the hatched region surrounded by the two broken lines indicated by $\epsilon^*=0.05$ to fabricate the semiconductor laser, the target laser of $\epsilon^* \leq \epsilon = 0.05$ can be obtained.

Due to the variations at the fabrication of the semiconductor laser, when taking into account the fact that values of parameters of the actually completed laser deviate from the designed values, desirably $R_f$ and $R_r$ of the designed values are selected on a line indicated by $\epsilon^*=0$ in FIG. 3.

However, in order to make the characteristics of the semiconductor laser other than the amount of fluctuation of the optical output due to the return light, for example, the threshold current value $I_{th}$ and the slope efficiency $\eta_s$, the desired values, they sometimes cannot always be selected on the line of $\epsilon^*=0$. Also in this case, desirably they should be as close to the line of $\epsilon^*=0$ as possible.

Figure 4:
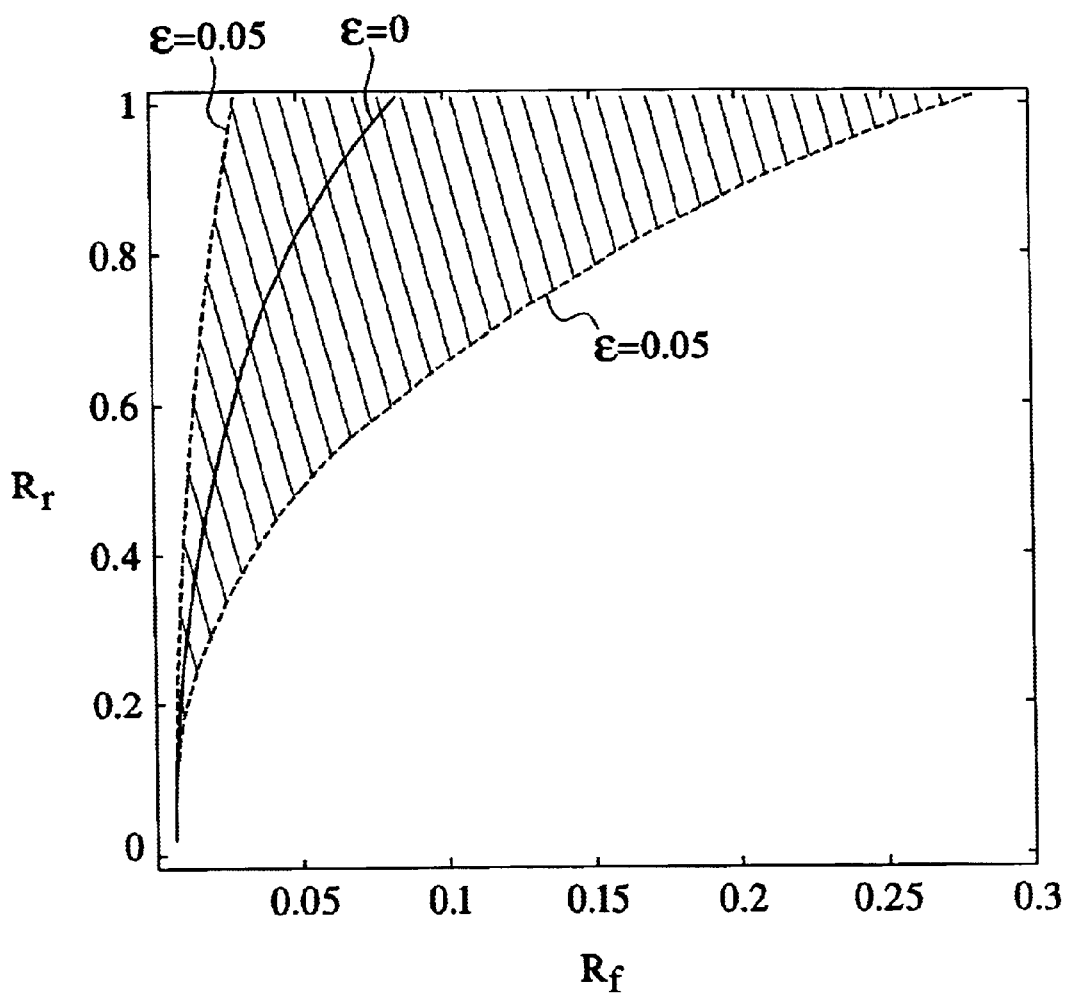
FIG. 4 is a view in which parameters of an AlGaAs semiconductor DH laser wherein $\epsilon^*$ becomes smaller than 0.05 are assigned in an equation, $\epsilon^*$ is calculated by a computer by using the reflectivities $R_f$ and $R_r$ of the forward and reverse reflection mirrors as variables, and they are expressed in the form of a contour.

By using a similar method to that described above, in the case of $P_{av}=30$ mW, the AlGaAs semiconductor DH laser in which $\epsilon^*$ becomes smaller than 0.05 can be obtained by selecting the forward and reverse reflectivities $R_f$ and $R_r$ in the hatched region surrounded by the two broken lines of $\epsilon^*=0.05$ shown in FIG. 4 when the rest of the structure is made the same as that described above. Also in this case, designed values near the line of $\epsilon^*=0$ as much as possible are selected.

In these examples, by using $R_f$ and $R_r$ as finally remaining parameters, these values were determined so that $\epsilon^*$ becomes the predetermined value. The reason why they were finally determined is that they can be freely easily determined in comparison with other parameters at the stage of design and fabrication of a semiconductor laser.

However, of course, it is also possible to perform the design so as to obtain a desired value of $\epsilon^*$ by adjusting other parameters.

For example, adjustment of the volume $V_a$ of the active region and the resonator length $L_{in}$ is relatively easy in the design or fabrication of a laser.

Further, by adopting a structure other than a DH structure, for example, a quantum well structure or a SCH structure, as the structure of the active region, the proportion $g_N$ of the increase of the gain with respect to the carrier density and the optical confinement coefficient $\Gamma$ can be adjusted to a certain extent.

Further, while the above examples concerned a semiconductor laser using a AlGaAs semiconductor as a material, as immediately understood from the above explanation, even in the case where another semiconductor material is used, by designing and fabricating this based on equation (29) by using parameters expressing the characteristics of the material, it is possible to make $\Delta P$ the predetermined proportion $\epsilon$ or less in $P_{av}$.

The explanation heretofore was made concerning a semiconductor laser having a Fabry-Perot resonator (hereinafter referred to as an FP laser), but in the case of a distributed Bragg reflector laser as well (hereinafter referred to as a DBR laser) replacing the reflection mirrors by grating waveguides, as shown below, by replacing the reflectivity and transmission rate for the opto-electric field amplitude of the reflection mirrors by the reflectivity and transmittance of the grating waveguides expressed by complex numbers, a laser apparatus in which the proportion of the optical output fluctuation $\Delta P$ with respect to the average output $P_{av}$ is placed in $\epsilon$ or less even if there is a change of the return light phase $\emptyset$ can be similarly constituted.

Further, in a vertical cavity surface emitting laser (VCSEL) using a vertical resonator as well, the reflection mirrors constituting the optical resonator can be considered equivalent to a DBR laser since it is a Bragg reflection unit comprising a multi-layer film made of semiconductor or a dielectric.

The reflectivity of the grating waveguide replacing the forward reflection mirror with respect to the electric field amplitude of the light is defined as $(R_f)^{1/2} \exp(i\psi_1)$ with respect to the light incident from the $-z$ direction and is defined as $(R_f)^{1/2} \exp(i\psi_2)$ with respect to the light incident from the $+z$ direction. The transmittance of this grating waveguide with respect to the electric field amplitude of the light is defined as $(T_f)^{1/2} \exp(i\psi_3)$.

Further, the reflectivity of the grating waveguide replacing the reverse reflection mirror with respect to the electric field amplitude of the light incident from the +z direction is defined as $(R_r)^{1/2}\exp(i\psi_4)$, and the transmittance of this grating waveguide with respect to the electric field amplitude is defined as $(T_r)^{1/2}\exp(i\psi_5)$.

When the relations (3), (4), and (5) standing among E, $E_f$, and $E_r$ are rewritten by using these amounts, the following equations are obtained:

$$E_f/\sqrt{n} = \sqrt{T_f r_r}\exp[(g-\alpha_i)L_{in} - \frac{4\pi i n L_{in}}{\lambda} + i\psi_3 + i\psi_4]E - \qquad (31)$$

$$\sqrt{\eta_r R_f R_{ofb}}\exp\left(i\psi_2 - \frac{4\pi i L_{in}}{\lambda}\right)E_f/\sqrt{n}$$

$$E = \sqrt{R_f R_r}\exp\left[(g-\alpha_i)L_{in} - \frac{4\pi i n L_{in}}{\lambda} + i\psi_1 + i\psi_4\right]E + \qquad (32)$$

$$\sqrt{\eta_t T_f R_{ofb}}\exp\left(i\psi_3 - \frac{4\pi i L_{ex}}{\lambda}\right)E_f/\sqrt{n}$$

$$E_f/\sqrt{n} = \sqrt{T_r}\exp\left[\frac{(g-\alpha_i)L_{in}}{2} - \frac{2\pi i n L_{in}}{\lambda} + i\psi_5\right]E \qquad (33)$$

When repeating analysis similar to the previous one by using these relations, it is understood that the equation of the forward optical output $P_f$ of the FP laser stands also with respect to the DBR laser as it is if the equations of Y and Z are rewritten as follows:

$$\hat{Z} \equiv e^{i(\psi_1+\psi_4)}\left[1 + \sqrt{\frac{n_t R_{ofb}}{R_f}}\, T_f \frac{\exp[i(-\emptyset + 2\psi_3 - \psi_1)]}{\hat{Y}}\right] \qquad (34)$$

$$\hat{Y} \equiv 1 + \sqrt{n_r R_f R_{ofb}}\exp[i(-\emptyset + \psi_2] \qquad (35)$$

The coupling constant of the grating waveguide is defined as K and the Bragg wavelength thereof is defined as $\lambda_0$. In many DBR lasers, in many cases, with respect to the coupling constant K, the loss or gain in the grating waveguide can be ignored or an amount $\delta\beta \equiv 2\Pi n (1/\lambda - 1/\lambda_0)$ expressing a deviation of the oscillation wavelength $\lambda$ of the DBR laser from the Bragg wavelength $\lambda_0$ can be ignored.

In these cases, a relations of $\psi_1+\psi_2=2\psi_3$ stands among the amounts $\psi_1$, $\psi_2$, and $\psi_3$ expressing phases of the reflectivity and the transmittance.

Therefore, below, assuming that the relation of $\psi_1+\psi_2=2\psi_3$ stands, $\hat{\emptyset}$ is defined as in the following equation in place of the return light phase $\emptyset$.

$$\hat{\emptyset} \equiv \emptyset - \psi_2 = \emptyset - 2\psi_3 - \psi_1 \qquad (36)$$

Then, it is understood that Y and $\hat{Y}$ and Z and $\hat{Z}$ are equal except the phase coefficient $\exp(i\psi_1+i\psi_4)$ over the entire $\hat{Z}$. Further, the forward optical output $P_f$ depends upon the absolute value $|Z|$ of Z, but does not depend upon the phase thereof.

Accordingly, the maximum value $\epsilon^*$ of the proportion of the fluctuation of the forward optical output $P_f$ with respect to the change of the return light phase $\emptyset$ becomes the same as that of the case of the FP laser already explained.

In the end, in many cases of a DBR laser as well, a semiconductor laser in which the absolute value $|\Delta P_f|$ of the fluctuation of the forward optical output is a constant proportion $\epsilon$ or less with respect to the average optical output $P_{av}$, that is, $|\Delta P_f|/P_{av} \leq \epsilon^* \leq \epsilon$, can be designed and fabricated by the same method as that of the case of an FP laser.

Note that the explanation was made by taking a semiconductor laser as an example, but the present invention is not limited to a semiconductor laser and can be applied to other laser apparatuses.

Namely, when the injected current I is replaced by the excitation $\Delta N^0$ and the threshold current value $I_{th}+\Delta I_{th}$ is replaced by the threshold value $\Delta N^{th}$ of the inverted distribution, the conclusion with respect to the semiconductor laser that "the optical output can be held constant even if the return light phase changes" stands with respect to a general laser.

In this case, the rate equations regarding equations (10) and (11) can be discussed as follows.

Namely, the rate equations for describing the operation of the laser are assumed as follows with respect to the number of photons S inside the laser resonator and the number of atoms $N_1$ at a lower level and the number of atoms $N_2$ at an upper level between two levels in a laser medium producing the inverted distribution due to the excitation.

$$\frac{dS}{dt} = \frac{c}{n}[g_N(N_2 - N_1) - g]S \qquad (37)$$

$$\frac{dN_2}{dt} = \Phi_2 - \gamma_2 N_2 - g_N(N_2 - N_1)S \qquad (38)$$

$$\frac{dN_1}{dt} = \Phi_1 - \gamma_1 N_1 + g_N(N_2 - N_1)S \qquad (39)$$

Here, it is assumed that the optical gain generated in the laser medium due to excitation is proportional to the inverted distribution $\Delta N \equiv N_2 - N_1$ and the proportional coefficient thereof was expressed by $g_N$. Further, the contribution of the spontaneously emitted light with respect to the change of the number of photons over time is not important, so is ignored in the following discussion. Further, excitations to respective levels are defined as $\Phi_1$ and $\Phi_2$ and relaxation constants of levels are defined as $\gamma_1$ and $\gamma_2$.

In the rate equations (37), (38), and (39), when finding S of the steady oscillation state while setting S>0 and $dS/dt = dN_2/dt = dN_1/dt = 0$, the following equation is obtained:

$$S = \frac{n}{2c g \tau}(\Delta N^0 - \Delta N_{th}) \qquad (40)$$

Here, $\Delta N_{th}$ indicates the threshold value of the inverted distribution, $\Delta N^0$ indicates an amount expressing the intensity of the excitation, and $\tau$ indicates the effective relaxation time of the laser. These are defined as follows:

$$\Delta N_{th} \equiv \frac{g}{g_N} \qquad (41)$$

$$\Delta N^0 \equiv \frac{\Phi_2}{\gamma_2} - \frac{\Phi_1}{\gamma_1} \qquad (42)$$

$$\tau \equiv \frac{1}{2}\left(\frac{1}{\gamma_2} + \frac{1}{\gamma_1}\right) \qquad (43)$$

Further, from S>0, equation (40) has meaning only when the excitation $\Delta N^0$ is larger than the threshold value $\Delta N_{th}$, that is, $\Delta N^0 > \Delta N_{th}$. In the case of $\Delta N^0 \leq \Delta N_{th}$, here, the contribution of the spontaneously emitted light is ignored, so S=0.

Further, equations (19) and (20) regarding the forward optical output $P_f$ and the slope efficiency $\eta_S$ mentioned above are expressed as in the following equations (44) and (45):

$$P_f = \eta_S(\Delta N^0 - \Delta N_{th}) \qquad (44)$$

$$\eta_S \equiv \frac{\hbar\omega}{2\tau} \frac{g - \alpha_i}{g} \frac{(1 - R_f)}{|Y|^2(1 - \sqrt{R_f R_r}|Z|)(1 + \sqrt{R_f/R_r}|Z|)} \quad (45)$$

Then, equation (29) is expressed as follows:

$$\epsilon^* = \frac{1}{2}\left|\left[\frac{\eta_S(0)}{\eta_S^0} - \frac{\eta_S(\pi)}{\eta_S^0} + \frac{1}{P_{av}}\frac{\eta_S^0}{g_N L_{in}}\left[\frac{\eta_S(0)}{\eta_S^0}\ln Z(0) - \frac{\eta_S(\pi)}{\eta_S^0}\ln Z(\pi)\right]\right]\right| \quad (46)$$

Note that, in this case, the forward optical output $P_f$ depends upon the return light phase $\emptyset = 4\Pi L_{ex}/\lambda$ through Y and Z contained in equations (41), (45), and (6) of $\Delta N_{th}$, $\eta_S$, and g.

In this way, when reading the injected current I as the excitation $\Delta N^0$ or the threshold current value $I_{th} + \Delta I_{th}$ as the threshold value $\Delta N_{th}$ of the inverted distribution, the discussion with respect to a semiconductor laser concluding that "the optical output can be held constant even if the return light phase changes" stands with respect to a general laser as well.

As explained above, according to the present invention, there is the advantage that the influence of the return light with respect to the optical output can be suppressed without causing an increase of the number of parts, an enlargement of the entire apparatus, and an increase of the power consumption.

While the invention has been described by reference to specific embodiments chosen for purposes of illustration, it should be apparent that numerous modifications could be made thereto by those skilled in the art without departing from the basic concept and scope of the invention.

What is claimed is:

1. A laser apparatus comprising:

an optical resonator including a first reflection mirror and a second reflection mirror opposing the first reflection mirror, the first reflection mirror having a reflectivity $R_f$ at a side where an optical output P is produced, the second reflection mirror having a reflectivity $R_r$ at a side opposite to the side of the first reflection mirror having the reflectivity $R_f$; and an optical system in which a part $R_{ofb}P$ ($0 < R_{ofb} < 1$) of the optical output P returns to the optical resonator as return light, wherein the reflectivities of the first and second reflection mirrors are related in accordance with the following relationship:

$$2\epsilon \geq \left|\left(\frac{\eta_{S1}}{\eta_S^0} - \frac{\eta_{S2}}{\eta_S^0}\right) + \frac{\eta_S^0}{P_{av}g_N L_{IN}}\left[\frac{\eta_{S1}}{\eta_S^0}\ln Z_1 - \frac{\eta_{S2}}{\eta_S^0}\ln Z_2\right]\right|,$$

where $$Y_1 = 1 + \sqrt{\eta_r R_{ofb} R_f},$$

$$Y_2 = 1 - \sqrt{\eta_r R_{ofb} R_f},$$

$$Z_1 = 1 + \sqrt{\frac{\eta_t R_{ofb}}{R_f}} \frac{(1 - R_f)}{Y_1},$$

$$Z_2 = 1 - \sqrt{\frac{\eta_t R_{ofb}}{R_f}} \frac{(1 - R_f)}{Y_2},$$

-continued $$g_1 = g^0 - \frac{1}{L_{in}}\ln Z_1,$$

$$g_2 = g^0 - \frac{1}{L_{in}}\ln Z_2,$$

$$\frac{\eta_{S1}}{\eta_S^0} = \frac{g^0(g_1 - \alpha_i)(1 - \sqrt{R_f R_r})(1 + \sqrt{R_f/R_r})}{g_1(g^0 - \alpha_i)Y_1^2(1 - \sqrt{R_f R_r}Z_1)(1 + \sqrt{R_f/R_r}Z_1)},$$

$$\frac{\eta_{S2}}{\eta_S^0} = \frac{g^0(g_2 - \alpha_i)(1 - \sqrt{R_f R_r})(1 + \sqrt{R_f/R_r})}{g_2(g^0 - \alpha_i)Y_2^2(1 - \sqrt{R_f R_r}Z_2)(1 + \sqrt{R_f/R_r}Z_2)},$$

$L_{in}$ is a resonator length of the optical resonator, $\alpha_i$ is an internal loss, $g_N$ is a differential gain, $\eta_t$ is a proportion of coupling of the return light with the light inside the laser, $\eta_r$ is a proportion of coupling of the return light with the output light from the laser, and $\eta_s^0$ and $g^0$, respectively, are an input/output efficiency and a threshold gain measured by a laser apparatus element where there is no return light, the relationship between the reflectivities of the first and second reflection mirrors being effective to produce the constant optical output P from said optical resonator under constant drive conditions, such that given a time average value $P_{av}$ of the optical output P, an absolute value $|\Delta P|$ of a fluctuation, $\Delta P = P - P_{av}$, of the optical output produced along with the change of a return light phase $\Phi$ is not more than the constant proportion $\epsilon$ with respect to $P_{av}$ and where $|\Delta P|/P_{av}$ is not more than $\epsilon$.

2. A laser apparatus as set forth in claim 1, wherein the optical system comprises an optical disk recording or reproducing optical system.

3. A laser as set forth in claim, wherein the optical system comprises an optical system coupled to an optical filter.

4. A semiconductor laser apparatus comprising:

an optical resonator including a first reflection mirror and a second reflection mirror opposing the first reflection mirror, the first reflection mirror having a reflectivity $R_f$ at a side where an optical output P is produced, the second reflection mirror having a reflectivity $R_r$ at a side opposite to the side of the first reflection mirror having the reflectivity $R_f$; and an optical system in which part $R_{ofb}P$ ($0 < R_{ofb} < 1$) of the optical output P returns to the optical resonator as return light, wherein the reflectivities of the first and second reflection mirrors are related in accordance with the following relationship:

$$2\epsilon \geq \left|\left(\frac{\eta_{S1}}{\eta_S^0} - \frac{\eta_{S2}}{\eta_S^0}\right) + \frac{eV_a \eta_S^0}{P_{av}\Gamma g_N L_{IN}\tau_S}\left[\frac{\eta_{S1}}{\eta_S^0}\ln Z_1 - \frac{\eta_{S2}}{\eta_S^0}\ln Z_2\right]\right|,$$

$$Y_1 = 1 + \sqrt{\eta_r R_{ofb} R_f},$$

$$Y_2 = 1 - \sqrt{\eta_r R_{ofb} R_f},$$

$$Z_1 = 1 + \sqrt{\frac{\eta_t R_{ofb}}{R_f}} \frac{(1 - R_f)}{Y_1},$$

$$Z_2 = 1 - \sqrt{\frac{\eta_t R_{ofb}}{R_f}} \frac{(1 - R_f)}{Y_2},$$

-continued $$g_1 = g^0 - \frac{1}{L_{in}}\ln Z_1,$$

$$g_2 = g^0 - \frac{1}{L_{in}}\ln Z_2,$$

$$\frac{\eta_{S1}}{\eta_S^0} = \frac{g^0(g_1 - \alpha_i)(1 - \sqrt{R_f R_r})(1 + \sqrt{R_f/R_r})}{g_1(g^0 - \alpha_i)Y_1^2(1 - \sqrt{R_f R_r}\, Z_1)(1 + \sqrt{R_f/R_r}\, Z_1)},$$

$$\frac{\eta_{S2}}{\eta_S^0} = \frac{g^0(g_2 - \alpha_i)(1 - \sqrt{R_f R_r})(1 + \sqrt{R_f/R_r})}{g_2(g^0 - \alpha_i)Y_2^2(1 - \sqrt{R_f R_r}\, Z_2)(1 + \sqrt{R_f/R_r}\, Z_2)},$$

$L_{in}$ is a resonator length, $\alpha_i$ is an internal loss, $V_a$ is a volume of an active region, $\Gamma$ is an optical confinement coefficient of the action region, $g_N$ is a proportion of an increase of the optical gain with respect to an increase of a carrier density of the active region, $\tau_S$ a carrier life of the carrier of the active region by spontaneous emission and a nonemission recoupling, $\eta_t$ a proportion of coupling of the return light with the light inside the laser, $\eta_r$ the proportion of coupling of the return light with the output light from the laser, $\eta_S^0$ and $g^0$, respectively, are a slope efficiency and the threshold gain measured by a laser apparatus element where there is no return light, and e is an amount of charge, the relationship between the reflectivities of the first and second reflection mirrors being effective to produce the constant optical output P from said optical resonator under constant drive conditions, such that given a time average value $P_{av}$ of the optical output P, an absolute value $|\Delta P|$ of a fluctuation, $\Delta P = P - P_{av}$, of the optical output produced along with the change of a return light phase $\Phi$ is not more than a constant proportion $\epsilon$ with respect to $P_{av}$ and where $|\Delta P|/P_{av}$ is not more than $\epsilon$.

5. A semiconductor laser as set forth in claim 4, wherein the optical resonator comprises a Fabry-Perot resonator including the surface of the semiconductor or a reflecting film on the surface of the semiconductor as a reflection mirror.

6. A semiconductor laser as set forth in claim 4, wherein the optical resonator comprises an optical resonator including a grating waveguide (DBR) built In the resonator as a reflection mirror.

7. A semiconductor laser as set forth in claim 4, wherein the semiconductor laser comprises a surface emitting type laser having a vertical resonator as optical resonator.

8. A semiconductor laser as set forth in claim 4, wherein the optical system comprises an optical disk recording or reproducing optical system.

9. A semiconductor laser as set forth in claim 4, wherein the optical system comprises an optical system coupled to an optical fiber.

* * * * *